US010128305B2

United States Patent
Kaneku et al.

(10) Patent No.: US 10,128,305 B2
(45) Date of Patent: Nov. 13, 2018

(54) SEMICONDUCTOR ELEMENT HAVING GROOVES WHICH DIVIDE AN ELECTRODE LAYER, AND METHOD OF FORMING THE GROOVES

(71) Applicant: Siemens Aktiengesellschaft, Munich (DE)

(72) Inventors: Sakari Kaneku, Okinawa (JP); Yasuhiro Shuto, Okinawa (JP); Akira Tachibana, Okinawa (JP)

(73) Assignee: SIEMENS HEALTHCARE GMBH, Erlangen (DE)

( * ) Notice: Subject to any disclaimer, the term of this patent is extended or adjusted under 35 U.S.C. 154(b) by 0 days.

(21) Appl. No.: 15/151,865

(22) Filed: May 11, 2016

(65) Prior Publication Data

US 2016/0254313 A1   Sep. 1, 2016

Related U.S. Application Data

(62) Division of application No. 14/298,158, filed on Jun. 6, 2014.

(30) Foreign Application Priority Data

Jun. 7, 2013  (JP) .................................. 2013-120970

(51) Int. Cl.
  *H01L 21/12* (2006.01)
  *H01L 21/105* (2006.01)
  (Continued)

(52) U.S. Cl.
  CPC .. *H01L 27/14698* (2013.01); *H01L 27/14696* (2013.01); *H01L 31/0224* (2013.01); *H01L 31/085* (2013.01)

(58) Field of Classification Search
  CPC ............. H01L 45/1691; H01L 45/1253; H01L 25/167; H01L 27/14–27/32;
  (Continued)

(56) References Cited

U.S. PATENT DOCUMENTS

| 5,723,866 A | 3/1998 | Hamilton, Jr. |
| 2004/0166654 A1* | 8/2004 | Matsuda ........... H01L 27/14687 438/460 |

(Continued)

FOREIGN PATENT DOCUMENTS

| JP | S60124879 A | 7/1985 |
| JP | H05251831 A | 9/1993 |

(Continued)

OTHER PUBLICATIONS

Ishibashi et al., Multi-Beam Semiconductor Laser System and Assembly Thereof, 1993, machine translation of JP 05251831 by EPO on Oct. 25, 2017, pp. 1-9.*

(Continued)

*Primary Examiner* — Natalia Gondarenko
(74) *Attorney, Agent, or Firm* — Harness, Dickey & Pierce, P.L.C.

(57) ABSTRACT

A semiconductor element is disclosed including a construction with electrode-dividing grooves, in which a dark current is smaller than in existing examples. A method of forming such grooves is also disclosed. In an embodiment, grooves, which electrically divide an electrode layer formed on the surface of a substrate, are formed with a V-shaped cross-sectional shape, groove side walls in the electrode layer, constituting the grooves, being sloping surfaces. An embodiment of the method of forming the grooves includes using a dicing blade having a blade distal end portion which is sharpened into a V-shape to cut a semiconductor wafer in which multiple patterns of semiconductor elements includ- (Continued)

ing an electrode layer on the surface of a substrate are formed, forming the grooves having a V-shaped cross-sectional shape which divide the electrode layer in each semiconductor element.

6 Claims, 6 Drawing Sheets

(51) Int. Cl.
*H01L 27/146* (2006.01)
*H01L 31/0224* (2006.01)
*H01L 31/08* (2006.01)
*H01L 21/10* (2006.01)
*H01L 21/28* (2006.01)

(58) Field of Classification Search
CPC ............... H01L 27/144; H01L 27/146; H01L 27/14643–27/14663; H01L 27/14658; H01L 27/1466; H01L 27/14681; H01L 31/0224; H01L 31/0236; H01L 31/0296; H01L 31/02363; H01L 31/105; H01L 31/107; H01L 31/18; H01L 31/09; H01L 21/024–21/02414; H01L 21/02469–21/0248; H01L 21/02551–21/02562; H01L 21/31144; H01L 21/30; H01L 21/302; H01L 21/304; H01L 21/3043; H01L 21/46; H01L 21/461; H01L 21/467; H01L 21/4896
USPC .......... 257/428, 170, 467, E21.002, E31.11, 257/E31.061, E29.347; 438/95, 48, 54, 438/57, 59
See application file for complete search history.

(56) References Cited

U.S. PATENT DOCUMENTS

| | | |
|---|---|---|
| 2005/0230627 A1 | 10/2005 | Protic et al. |
| 2011/0000545 A1 | 1/2011 | Nishi et al. |
| 2011/0284754 A1 | 11/2011 | Ishii et al. |
| 2012/0111405 A1 | 5/2012 | Cho |
| 2015/0177558 A1* | 6/2015 | Sugihara ........... G02F 1/133351 174/261 |

FOREIGN PATENT DOCUMENTS

| | | | |
|---|---|---|---|
| JP | H06260671 A | | 9/1994 |
| JP | 2004128238 A | | 4/2004 |
| JP | 2011029625 A | | 2/2011 |
| JP | 2012-023235 A | | 2/2012 |
| JP | 2012023235 A | * | 2/2012 |
| JP | 2012-103036 A | | 5/2012 |
| JP | 2013120970 A | | 6/2013 |

OTHER PUBLICATIONS

Iwase Yoshitomo, Semiconductor Radiation Detector and Manufacture thereof, 1994, machine translation by JPO of JP 06-260671 A on Feb. 6, 2018, pp. 1-5.*
Sunaga et al., Radiation Detector, 2012, machine translation by JPO of JP 2012-103036 on Feb. 6, 2018, pp. 1-17.*
Japanese Priority Document for Japanese Application 2013-120970.
Japanese Office Action for Corresponding Japanese Application No. 2013-120970 dated Jan. 31, 2017 and English language translation thereof.
Japanese Office Action for Corresponding Japanese Application No. 2013-120970 dated Oct. 3, 2017 and English language translation thereof.

* cited by examiner (A)

(B)

SEMICONDUCTOR ELEMENT HAVING GROOVES WHICH DIVIDE AN ELECTRODE LAYER, AND METHOD OF FORMING THE GROOVES

PRIORITY STATEMENT

The present application is a divisional of and claims priority under 35 U.S.C. §§ 120/121 to U.S. patent application Ser. No. 14/298,158 filed Jun. 6, 2014, which claims priority under 35 U.S.C. § 119 to Japanese patent application number JP 2013-120970 filed Jun. 7, 2013, the entire contents of each of which are hereby incorporated herein by reference.

TECHNICAL FIELD

At least one embodiment of the technique disclosed herein generally relates to a technique for forming grooves in a semiconductor element by cutting, for example by dicing.

BACKGROUND

Currently, in various fields such as nuclear physics and radiotherapy use is made of semiconductor elements for detecting radiation, formed from group II-VI semiconductors, typically CdTe-based compound semiconductors. In recent years it has been proposed to obtain images using these semiconductor elements, and in order to achieve this it is deemed necessary for an electrode layer formed on the surface of the element to be divided electrically to form a pixelated semiconductor element which has multiple pixels (picture elements). One technique for forming such a pixelated semiconductor element is disclosed in Japanese Patent Kokai 2004-128238.

Japanese Patent Kokai 2004-128238 discloses a method in which an electrode layer on a substrate surface is cut mechanically by half-cut dicing or the like, the electrode being divided by means of the cut grooves. More specifically, a semiconductor wafer is subjected to half-cutting by dicing using a dicing blade (dicing saw), forming dividing grooves having a rectangular cross section and a target width of 50 to 200 μm, as shown in FIG. 2 of Japanese Patent Kokai 2004-128238.

A dark current (leakage current) is a factor which determines the performance of a semiconductor element for detecting radiation. To elaborate, it is known that an element having a small dark current has a high performance, and it is thus essential to reduce the dark current in order to improve the performance of future semiconductor elements. On the other hand, with a construction having dividing grooves formed using the abovementioned known mechanical cutting method it is difficult to suppress the dark current to a level that can meet existing or future demands, and it is problematic for semiconductor elements having satisfactory performance to be manufactured with a good yield.

SUMMARY

At least one embodiment the present invention proposes a semiconductor element having a grooved construction in which the dark current is smaller than in existing examples, and a method of forming such grooves.

A semiconductor element according to one mode of embodiment of the present invention, proposed in response to the problems, is provided with an electrode layer formed on the surface of a substrate, and grooves which electrically divide said electrode layer, characterized in that groove side walls in the abovementioned electrode layer, constituting the abovementioned grooves, are sloping surfaces. In one mode of embodiment, the cross-sectional shape of such grooves can be V-shaped or U-shaped with corner portions of the opening thereof being chamfered.

One mode of embodiment of a method of forming the grooves in the abovementioned semiconductor element according to the present invention includes using a dicing blade having a blade distal end portion which is sharpened into a V-shape to cut a semiconductor wafer in which multiple patterns of semiconductor elements comprising an electrode layer on the surface of a substrate are formed, forming the grooves having a V-shaped cross-sectional shape which divide the electrode layer in each semiconductor element.

Another mode of embodiment of a method of forming the grooves according to the present invention includes using a first dicing blade having a blade distal end portion which is sharpened into a V-shape to cut a semiconductor wafer in which multiple patterns of semiconductor elements comprising an electrode layer on the surface of a substrate are formed, and after this cutting has been performed, using a second dicing blade having a blade width that is narrower than a blade width of the first dicing blade to increase the depth of said V-shaped grooves, forming grooves the corner portions of the openings of which are chamfered and which divide the electrode layer in each of the semiconductor elements.

Yet another mode of embodiment of a method of forming the grooves according to the present invention includes using a first dicing blade to cut a semiconductor wafer in which multiple patterns of semiconductor elements comprising an electrode layer on the surface of a substrate are formed, and after this cutting has been performed, using a second dicing blade, having a blade width that is wider than a blade width of the first dicing blade and having a blade distal end portion that is sharpened into a V-shape, to cut corner portions of the openings of said grooves, forming grooves the corner portions of the openings of which are chamfered and which divide the electrode layer in each of the semiconductor elements.

BRIEF DESCRIPTION OF THE DRAWINGS

The above-described properties, features and advantages of this invention, and also the way in which they are achieved, will be explained more clearly and precisely in connection with the following description of the example embodiments which will be explained in greater detail in connection with the drawings, in which.

DETAILED DESCRIPTION OF THE EXAMPLE EMBODIMENTS

Figure 1:
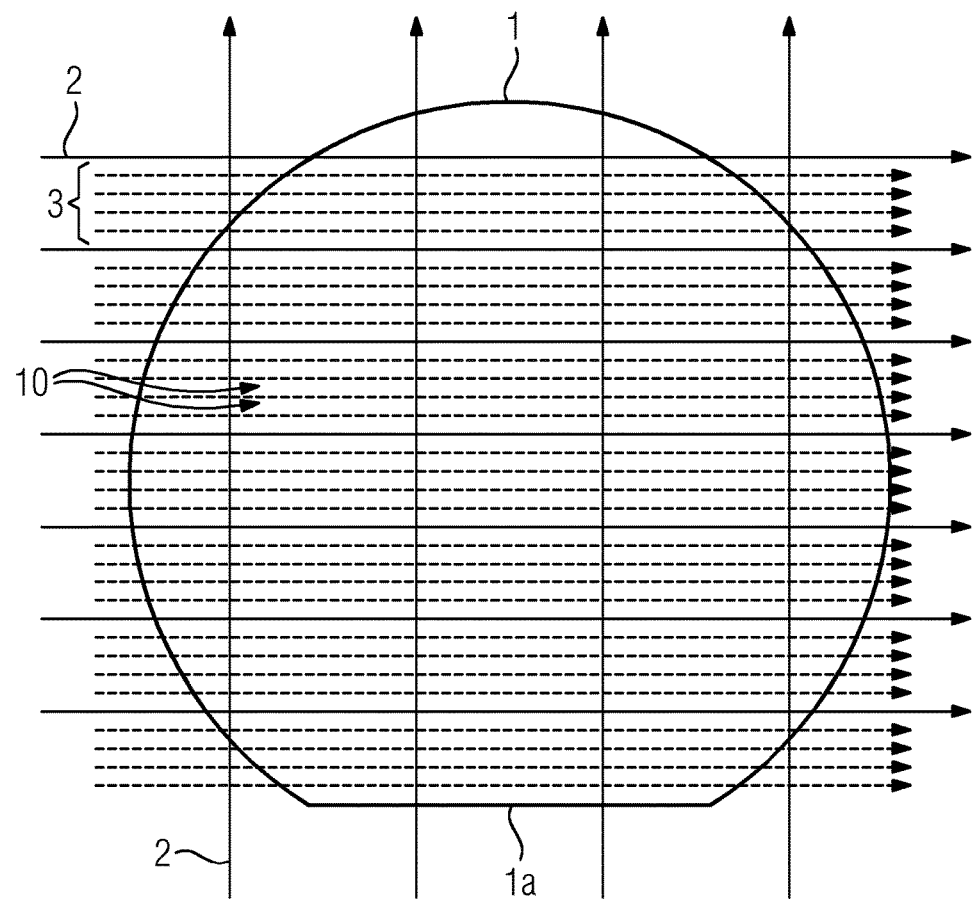
FIG. 1 is a drawing illustrating an example of a dicing method whereby a semiconductor wafer is cut to form grooves.

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

Before discussing example embodiments in more detail, it is noted that some example embodiments are described as processes or methods depicted as flowcharts. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Methods discussed below, some of which are illustrated by the flow charts, may be implemented by hardware, software, firmware, middleware, microcode, hardware description languages, or any combination thereof. When implemented in software, firmware, middleware or microcode, the program code or code segments to perform the necessary tasks will be stored in a machine or computer readable medium such as a storage medium or non-transitory computer readable medium. A processor(s) will perform the necessary tasks.

Specific structural and functional details disclosed herein are merely representative for purposes of describing example embodiments of the present invention. This invention may, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

Several embodiments of the present invention will now be described with reference to the drawings. In the embodiments described hereinbelow, a semiconductor element for detecting radiation, formed using a CdTe semiconductor from among the group II-VI semiconductors, is shown by way of example. This semiconductor element is a pixelated semiconductor detection element having an electrode layer on the surface (one or both of the main obverse surface and the reverse surface) of a CdTe crystalline substrate, the electrode layer being electrically divided by means of grooves which penetrate through the electrode layer to the interior of the substrate, forming multiple pixel electrodes.

Figure 2:
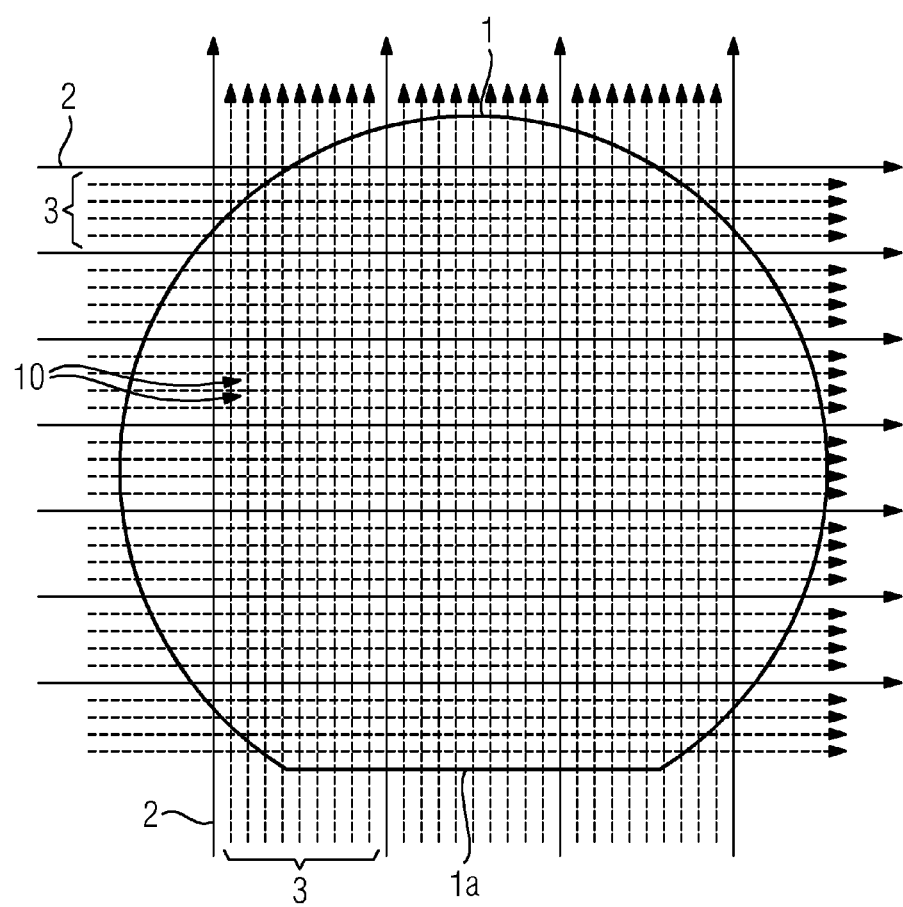
FIG. 2 is a drawing illustrating another example of a dicing method whereby a semiconductor wafer is cut to form grooves.

FIG. 1 and FIG. 2 illustrate dicing methods in which grooves are formed by cutting a CdTe semiconductor wafer 1 in which are formed patterns of semiconductor elements having an electrode layer (before cutting) on the surface of a CdTe crystalline substrate. When dicing is to be performed, full-cut dicing lines 2 indicated by solid lines and half-cut dicing lines 3 indicated by dotted lines are defined taking an orientation flat 1a on the semiconductor wafer 1 as a reference. The full-cut dicing lines 2 are lines for cutting and separating the elements, established between each semiconductor element 10. On the other hand, the half-cut dicing lines 3 are groove-forming lines for dividing the electrode layer on the substrate surface in each respective semiconductor element 10. By carrying out dicing along the half-cut dicing lines 3, in the case in FIG. 1, multiple pixel electrodes, pixelated in the shape of scanning lines, are formed in each semiconductor element 10, and in the case in FIG. 2, multiple pixel electrodes, pixelated in the shape of dots, are formed in each semiconductor element 10.

Figure 3:
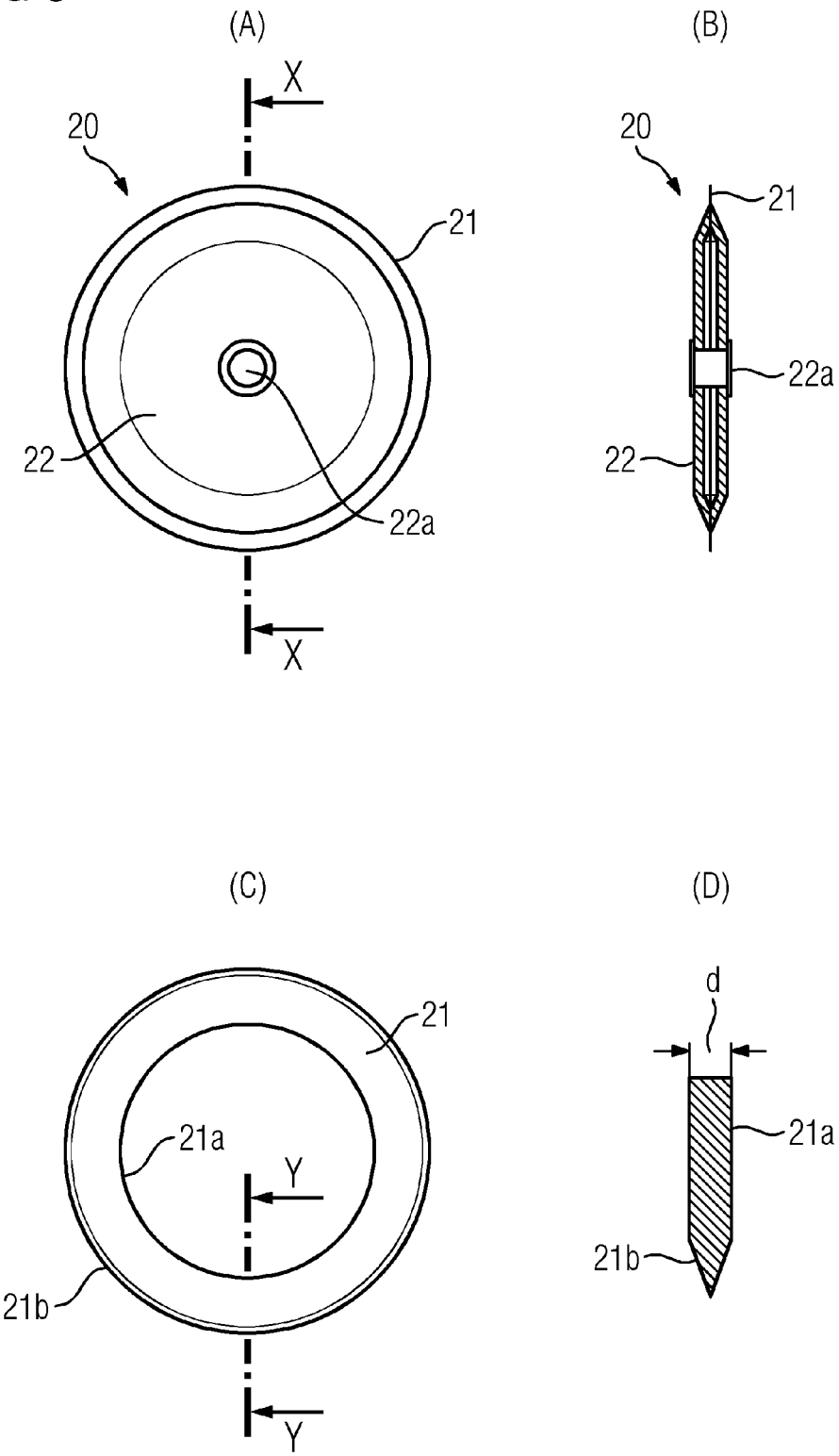
FIG. 3 is a drawing illustrating an embodiment of a dicing blade used to form grooves.

An embodiment of a dicing blade used to effect half-cut dicing along lines 3 such as those illustrated in FIG. 1 and FIG. 2, is illustrated in FIG. 3. FIG. 3A and FIG. 3B illustrate schematically a blade assembly 20 which is mounted on a dicing device, which is not shown in the drawings, and FIG. 3C and FIG. 3D illustrate in detail a dicing blade 21 which is fixed to the blade assembly 20.

FIG. 3A is a plan view of the blade assembly 20, and FIG. 3B is a cross-sectional view as seen through the section line X-X in FIG. 3A. In the drawings, the dicing blade 21 is fixed to a peripheral edge portion of a disk-shaped blade attachment 22 by clamping or the like, the blade attachment 22, to the circumferential edge portion of which the dicing blade 21 is fixed, being mounted by means of a shaft support hole 22a at its center on a rotating shaft of the dicing device which is not shown in the drawings.

The details of the dicing blade 21 are as illustrated in FIG. 3C and FIG. 3D. FIG. 3C is a plan view of the dicing blade 21, and FIG. 3D is an enlarged cross-sectional view of the dicing blade 21 as seen through the section line Y-Y in FIG. 3C. The dicing blade 21 is ring-shaped, an inner circumferential edge portion 21a thereof being fixed to the circumferential edge portion of the blade attachment 22. The outer circumferential edge portion of the dicing blade 21, in other words the blade distal end portion 21b, is sharpened into a V-shape, serving as a cutting edge for dicing.

Figure 4:
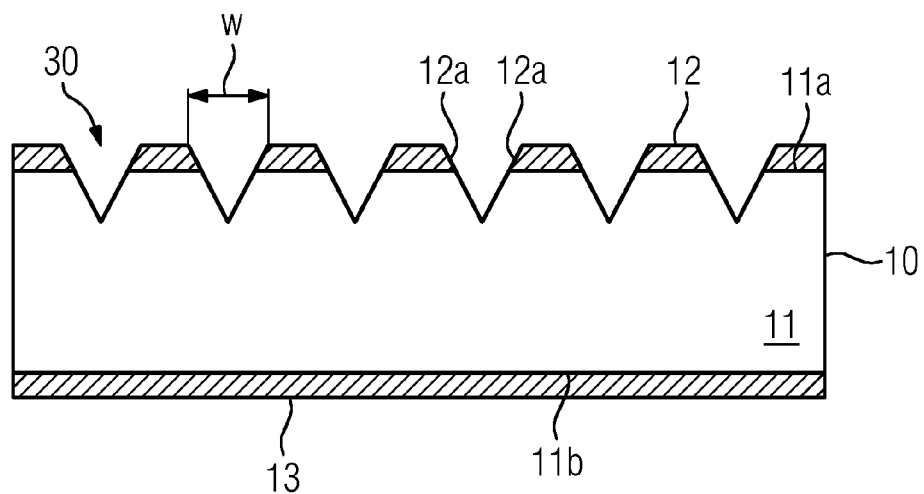
FIG. 4 is a schematic cross-sectional view of a semiconductor element according to a first embodiment of the present invention.

FIG. 4 is a cross-sectional view illustrating multiple grooves formed by effecting the dicing shown in FIG. 1 or FIG. 2 using this dicing blade 21. The grooves 30 illustrated in FIG. 4 are formed by using the dicing blade 21, the blade distal end portion 21b of which has been sharpened into a V-shape as illustrated in FIG. 3, to cut the semiconductor wafer 1, in which multiple patterns of semiconductor elements 10 have been formed, along the dicing lines 3 illustrated in FIG. 1 or FIG. 2 using half-cut dicing. Said grooves 30 have a V-shaped cross-sectional shape which divides the electrode layer in each semiconductor element 10. The angle of the distal end cutting edge of the dicing blade 21 which forms the V-shapes is at least equal to 40° and at most equal to 120°.

Each individual semiconductor element 10 has on the outer surfaces of a CdTe crystalline substrate 11, in the case shown in FIG. 4 on both a main obverse surface 11a and a reverse surface 11b, a first electrode layer 12 and a second electrode layer 13. Of these, the first electrode layer 12 formed on the main obverse surface 11a is electrically divided by means of grooves 30 having a V-shaped cross-sectional shape formed by the abovementioned cutting. The cross-sectional shape of each groove 30 is formed in a V-shape, and therefore groove side walls 12a in the first electrode layer 12, constituting the grooves 30, are sloping surfaces (inclined surfaces that are not perpendicular to the main obverse surface 11a). A blade width d (see FIG. 3D) of the dicing blade 21 for forming the grooves 30 is such that d≥w relative to an opening width w (see FIG. 4) of the grooves 30.

Figure 5:
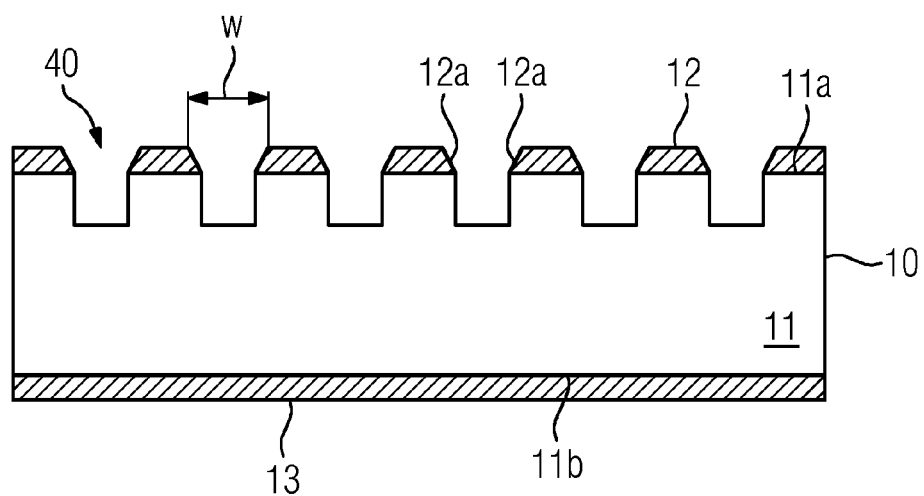
FIG. 5 is a schematic cross-sectional view of a semiconductor element according to a second embodiment of the present invention.

FIG. 5 is a cross-sectional view illustrating multiple grooves formed by effecting the dicing shown in FIG. 1 or FIG. 2 using the dicing blade 21 and a separate dicing blade having a rectangular blade distal end portion such as that in Japanese Patent Kokai 2004-128238, the entire contents of which are hereby incorporated herein by reference. The grooves 40 illustrated in FIG. 5 divide the electrode layer in each semiconductor element 10, corner portions of the openings thereof being chamfered (12a). The semiconductor element 10 has the same construction as in the case in FIG. 4, except for the grooves 40, the first electrode layer 12 formed on the main obverse surface 11a being electrically divided by way of the grooves 40.

The grooves 40 illustrated in FIG. 5 are formed by a two-stage cutting process as described hereinbelow.

Firstly, using a first dicing blade 21, the blade distal end portion 21b of which has been sharpened into a V-shape as illustrated in FIG. 3C and FIG. 3D, the semiconductor wafer 1, in which multiple patterns of semiconductor elements 10 have been formed, is cut along the dicing lines 3 illustrated in FIG. 1 or FIG. 2 using half-cut dicing.

Next, using a second dicing blade (which is omitted from the drawings) the blade distal end portion of which is rectangular and which has a blade width d' that is narrower than the width of the openings of the V-shaped grooves formed by cutting using the first dicing blade 21, half-cut dicing is effected along the dicing lines 3. By this means the V-shaped grooves (the substrate 11 exposed within the grooves) formed by the first dicing blade 21 are made deeper. In this process, the blade width d' that is narrower than the width of the openings of the V-shaped grooves can be achieved by arranging that, compared with the blade width d illustrated in FIG. 3D, [the blade width d' of the second dicing blade]<[the blade width d of the first dicing blade 21]. The blade width d of the first dicing blade 21 is such that d≥w (the width of the openings of the grooves 40).

Further, the two-stage cutting process forming the grooves 40 can be modified as follows.

Firstly, using as a first dicing blade a dicing blade (which is omitted from the drawings) the blade distal end portion of which is rectangular, the semiconductor wafer 1, in which multiple patterns of semiconductor elements 10 have been formed, is cut along the dicing lines 3 illustrated in FIG. 1 or FIG. 2 using half-cut dicing.

Next, using a second dicing blade 21, a blade distal end portion 21b of which is sharpened into a V-shape and which has a blade width that is wider than the width of the openings of the U-shaped grooves formed by cutting using the first dicing blade, half-cut dicing is effected along the dicing lines 3. By this means the corner portions of the openings of the U-shaped grooves formed by the first dicing blade (in other words the corner portions of the electrode layer 12) are cut. In this process, if the blade width of the first dicing blade is d', a blade width that is wider than the width of the openings of the U-shaped grooves can be achieved by arranging that, compared with the blade width d illustrated in FIG. 3D, [the blade width d' of the first dicing blade]<[the blade width d of the second dicing blade 21]. The blade width d of the second dicing blade 21 is such that d≥w (the width of the openings of the grooves 40).

According to these groove-forming processes, a cutting process is included that uses a wide dicing blade 21 the blade distal end portion 21b of which is sharpened into a V-shape, and therefore the walls of the opening portions constituting the grooves 40, in other words the groove side walls 12a in the first electrode layer 12 constituting the grooves 40, are sloping surfaces. By this means, the cross-sectional shape of the grooves 40 is a U-shape, corner portions of the opening thereof being chamfered (in other words, a rectangle the corner portions of the opening of which are chamfered). The angle of the distal end cutting edge of the dicing blade 21 which has a V-shape, used to form the chamfered sections of the grooves 40, is at least equal to 40° and at most equal to 120°.

Figure 6:
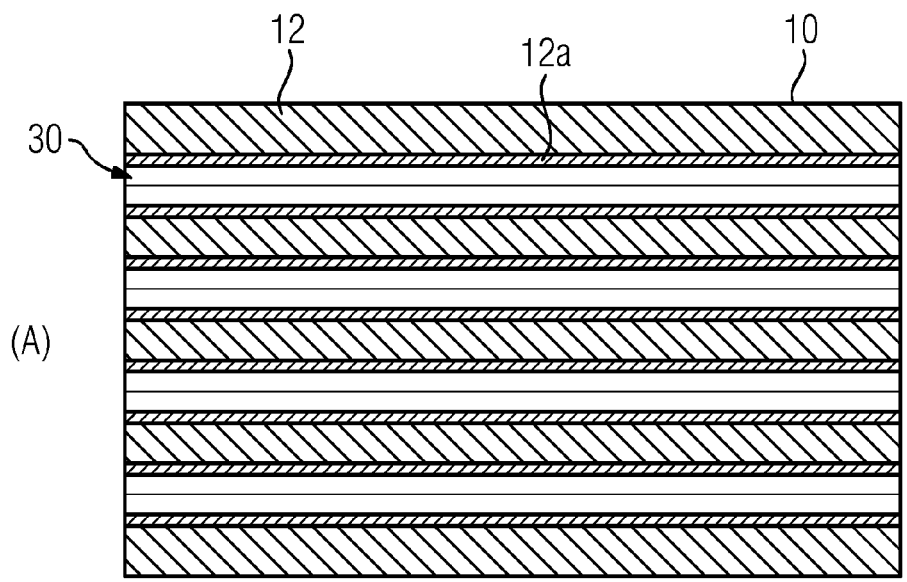
FIG. 6 is a schematic plan view of semiconductor elements, illustrating the arrangement of grooves according to the dicing method in FIG. 1 and the arrangement of grooves according to the dicing method in FIG. 2.
Figure 6:
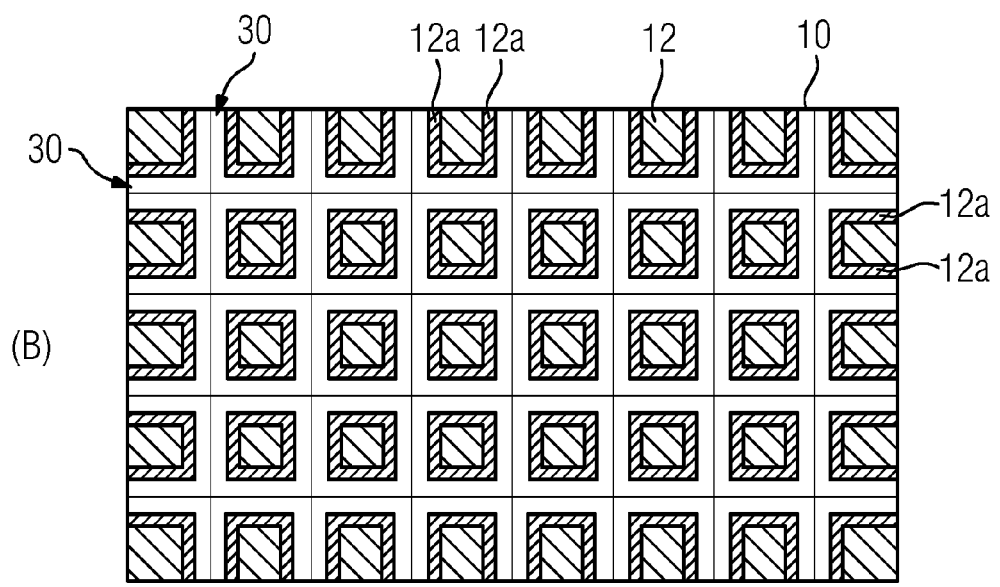

FIG. 6 shows by way of example a schematic plan view of semiconductor elements 10 in which grooves 30 having a V-shaped cross-sectional shape as illustrated in FIG. 4 have been formed. FIG. 6A illustrates a semiconductor element 10 provided with grooves 30 formed by means of the dicing method in FIG. 1, and FIG. 6B illustrates a semiconductor element 10 provided with grooves 30 formed by means of the dicing method in FIG. 2. In the case in FIG. 6A, which corresponds to the dicing method in FIG. 1, multiple grooves 30 formed in the semiconductor element 10 are formed in one direction only, and therefore the first electrode layer 12 is pixelated in the shape of strips, multiple pixel electrodes arranged in the shape of scanning lines being formed in the semiconductor element 10. In the case in FIG. 6B, which corresponds to the dicing method in FIG. 2, multiple grooves 30 formed in the semiconductor element 10 form a lattice in two orthogonal directions, and therefore the first electrode layer 12 is pixelated in the shape of a matrix, multiple pixel electrodes arranged in the shape of dots being formed in the semiconductor element 10.

Figure 7:
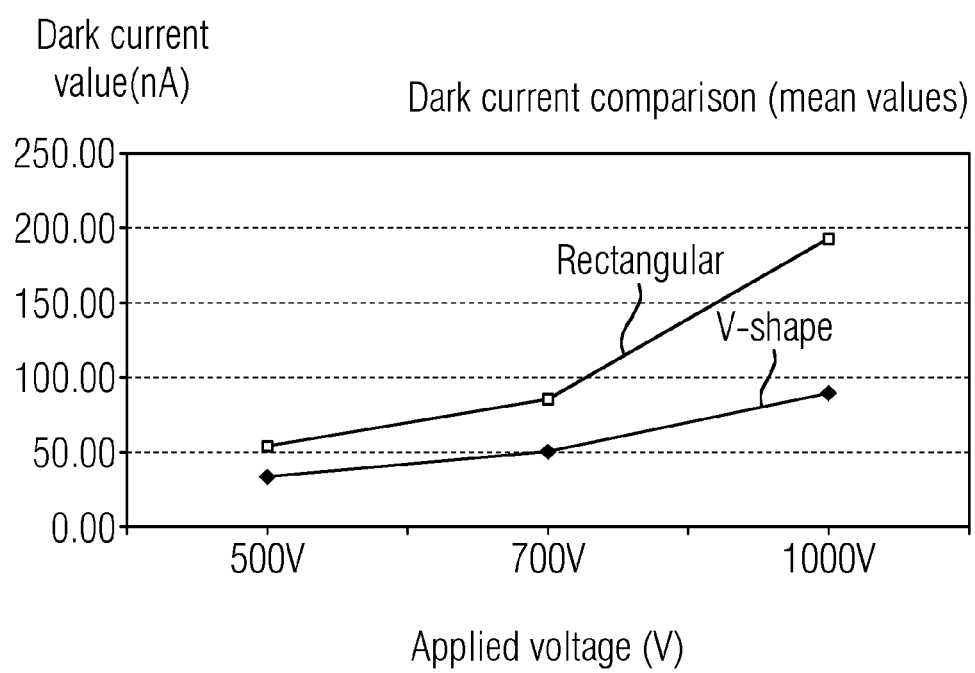
FIG. 7 is a graph comparing the dark currents in a semiconductor element having rectangular grooves and a semiconductor element having V-shaped grooves.

With regard to the dark current in a semiconductor element for detecting radiation in which V-shaped grooves 30 such as those illustrated in FIG. 4 have been formed, FIG. 7 shows a graph of the results of a comparison with the dark current in a semiconductor element for detecting radiation in which rectangular grooves (without chamfering) such as those illustrated in Japanese Patent Kokai 2004-128238 have been formed. For the V-shaped grooves 30 and for the rectangular grooves respectively, the voltage (V) applied to multiple semiconductor elements was varied between 500V and 1000V, and the dark current value (nA) was measured and a mean value was obtained. It can be seen that for each applied voltage, the dark current was lower with the semiconductor elements in which V-shaped grooves 30 had been formed. Further, the results show that the difference increases as the applied voltage increases.

In the case of the rectangular grooves used in the comparison, the groove side walls are cut perpendicularly from the electrode layer to the interior of the substrate, and the side walls in the electrode layer at both sides of the groove face each other. On the other hand, in the case of the V-shaped grooves 30, the groove side walls in the electrode layer section are sloping surfaces (oblique surfaces), and the side walls in the electrode layer at both sides of the groove do not face each other. Further, because they are sloping surfaces, the width w of the openings of the grooves (see FIG. 4 and FIG. 5), in other words the width w of the divisions in the first electrode layer 12, is relatively wide. These are thought to be some of the factors which give rise to the differences shown in FIG. 7.

According to the present invention described using the abovementioned embodiments by way of example, a semiconductor element having a grooved construction in which the dark current is smaller than in existing examples, and a method of forming such grooves, are provided. Therefore, in particular in semiconductor elements for detecting radiation, the dark current can be suppressed more than at present, and a semiconductor element having improved performance can be manufactured with a good yield. Further, according to the method of forming grooves according to at least one embodiment of the present invention, the method can be implemented by exchanging the dicing blade for one having a suitable blade distal end portion shape, and the method therefore has the advantage that existing equipment can be used.

Several embodiments have been described hereinabove in relation to the present invention. However various embodiments other than those in said embodiments can be arrived at, and thus the present invention should be interpreted on the basis of the scope of the patent claims.

The patent claims filed with the application are formulation proposals without prejudice for obtaining more extensive patent protection. The applicant reserves the right to claim even further combinations of features previously disclosed only in the description and/or drawings.

The example embodiment or each example embodiment should not be understood as a restriction of the invention. Rather, numerous variations and modifications are possible in the context of the present disclosure, in particular those variants and combinations which can be inferred by the person skilled in the art with regard to achieving the object for example by combination or modification of individual features or elements or method steps that are described in connection with the general or specific part of the description and are contained in the claims and/or the drawings, and, by way of combinable features, lead to a new subject matter or to new method steps or sequences of method steps, including insofar as they concern production, testing and operating methods.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program, tangible computer readable medium and tangible computer program product. For example, of the aforementioned methods may be embodied in the form of a system or device, including, but not limited to, any of the structure for performing the methodology illustrated in the drawings.

Although the invention has been illustrated and described in detail on the basis of the preferred example embodiment, the invention is not limited by the disclosed examples and other variations can be derived herefrom by the person skilled in the art, without departing from the scope of protection of the invention.

The invention claimed is:

1. A method of forming grooves in a semiconductor element having an electrode layer on a surface of a substrate, comprising:
   dividing the electrode layer using a dicing blade, having a blade distal end portion sharpened into a V-shape, by cutting V-shaped grooves into the electrode layer and a substrate layer of a semiconductor wafer in which multiple patterns of semiconductor elements having the electrode layer on a surface of the substrate layer are formed; and
   forming rectangular shaped grooves only in the substrate layer by cutting groove side walls of the rectangular shaped grooves from a bottom surface of the electrode layer to a flat groove bottom surface formed in the substrate while retaining the V-shaped grooves only in the electrode layer to divide the electrode layer of the semiconductor element.

2. A method of forming grooves in a semiconductor element, comprising:
   using a first dicing blade, including a blade distal end portion sharpened into a V-shape, to cut a plurality of V-shaped grooves into an electrode layer and a substrate layer of a semiconductor wafer in which multiple patterns of semiconductor elements having the electrode layer on a surface of the substrate layer are formed; and
   after the cutting with the first dicing blade has been performed, using a second dicing blade, including a blade distal end portion having a rectangular shape and width relatively narrower than a blade width of the first dicing blade, to increase a depth of the V-shaped grooves in a substrate and altering the V-shaped grooves in the substrate to have straight sidewalls from a bottom of the electrode layer to a flat groove bottom surface formed in the substrate by the second dicing blade, wherein corner portions of openings of the V-shaped grooves only in the electrode layer are chamfered.

3. The method of claim 1, wherein multiple pixel electrodes for detecting radiation are formed by dividing the electrode layer by way of the grooves.

4. The method of claim 3, wherein the semiconductor wafer is a CdTe-based compound semiconductor wafer.

5. The method of claim 2, wherein multiple pixel electrodes for detecting radiation are formed by dividing the electrode layer by way of the grooves.

6. The method of claim 5, wherein the semiconductor wafer is a CdTe-based compound semiconductor wafer.

* * * * *